United States Patent
Endo et al.

(10) Patent No.: US 6,277,441 B1
(45) Date of Patent: Aug. 21, 2001

(54) METHOD OF FORMING COATING FILM ON A SUBSTRATE

(75) Inventors: Hiroki Endo; Hideya Kobari; Koji Ueda; Hiroyoshi Sago, all of Kanagawa-ken (JP)

(73) Assignee: Tokyo Ohka Kogyo Co., Ltd., Kanagawa (JP)

(*) Notice: Subject to any disclaimer, the term of this patent is extended or adjusted under 35 U.S.C. 154(b) by 0 days.

(21) Appl. No.: 08/389,119

(22) Filed: Feb. 15, 1995

(30) Foreign Application Priority Data

Feb. 17, 1994 (JP) .................................................. 6-020439

(51) Int. Cl.⁷ ...................................................... B05D 3/12
(52) U.S. Cl. ........................................ 427/240; 427/385.5
(58) Field of Search .................................. 427/240, 385.5; 437/231

(56) References Cited

U.S. PATENT DOCUMENTS 4,748,053 * 5/1988 Okada ................................. 427/240

FOREIGN PATENT DOCUMENTS 62-190838   8/1987  (JP) .
63-313160  12/1988  (JP) .
2156626     6/1990  (JP) .

* cited by examiner

Primary Examiner—Shrive Beck
Assistant Examiner—Jennifer Calcagni
(74) Attorney, Agent, or Firm—Carrier, Blackman & Associates, P.C.; Joseph P. Carrier; William D. Blackman

(57) ABSTRACT

According to the invention disclosed, application liquid such as spin-on-glass (SOG) is dropped on the surface of a substrate such as a semiconductor wafer having irregularities thereon and is dispersed on the substrate surface using a centrifugal force generated by rotating the substrate. The rotation of the substrate is performed in a first rotational action at a low speed and a second rotational action at a high speed, the first and second rotational actions being separated by a time interval. The second rotation may be at a constant speed. Alternatively, the rotational speed of the second rotational action may comprise rotation at an intermediate speed continuously followed by rotation at a higher speed. The time interval between the first and second rotational actions is ten times the duration of the first rotational action or longer. The duration of the second rotational action is three times that of the first rotational action or longer. Such time interval and relative durations make the application liquid more conformable to the substrate surface and causes the application liquid to be sufficiently dispersed on the substrate to provide a film having the desired thickness on the substrate, even though the substrate has irregularities thereon.

19 Claims, 4 Drawing Sheets

METHOD OF FORMING COATING FILM ON A SUBSTRATE

BACKGROUND OF THE INVENTION

1. Field of the Invention

The present invention relates to a method of forming a coating film on the surface of a glass substrate, semiconductor wafer, and the like having irregularities.

2. Description of the Related Art

There are known methods of forming coating films on substrates. FIG. 8 is a graph showing the relationship between rotational speed and elapsed time in a conventional method of forming an SOG (spin-on-glass which is a solution obtained by dissolving a silicon compound in an organic solvent or a silicon oxide film formed by applying and baking this solution) film on an object to be processed in the form of a plate (hereinafter referred to as a substrate) such as a semiconductor wafer as a flattening film using a spinner. On this graph, the rotational speed (rpm) and the elapsed time (second) are shown along the vertical and horizonal axes, respectively. In the conventional method, the rotational speed of the spinner is immediately increased to approximately 5000 rpm and is maintained at that value for about three seconds in which period coating is completed.

FIG. 9 is a sectional view of major parts of a substrate showing the thickness of an SOG film formed using the above-described conventional coating film forming method. Twin patterns 101 and 102 and a global pattern 103 of aluminum or the like are formed on the surface of the substrate W shown. It is difficult for the applied solution 104 to enter the gap between the twin patterns 101 and 102, which makes the thickness $T_1$ of the SOG film smaller than the desired thickness. Conversely, the thickness $T_2$ of the film on the global pattern 103 becomes greater than the desired thickness. The unevenness of the film having undesirable film thicknesses necessitates an additional etch-back process to correct the film.

On the other hand, methods for applying resist are disclosed in Japanese unexamined patent publications S62-190838, S63-313160, and H2-156626 wherein a resist film having a uniform thickness is formed on a flat substrate surface.

According to the methods disclosed in those patent publications, the rotation of a substrate is separated into first and second rotational actions having different rotational speeds. These methods are not successful in forming a uniform film using an SOG solution.

A direct application of the methods wherein the rotation of a substrate is separated into first and second rotational actions to a substrate having irregularities formed on the surface thereof will not provide the desired film thickness and will therefore necessitate an additional etch-back process. This also results in the need for separately preparing a device for performing such an etch-back process. In addition, there are problems including the waste of materials because of the need for removing the SOG film which has been once formed.

SUMMARY OF THE INVENTION

According to the present invention, there is provided a method of forming a coating film by dropping application liquid on the surface of a substrate such as a semiconductor wafer having irregularities, such as wiring formed thereon, and dispersing the application liquid on the substrate surface using a centrifugal force generated by rotating the substrate wherein the rotation of the substrate is separated into first and second rotational actions. The first rotation is low speed rotation on the order of 1000 rpm while the second rotational actions is high speed rotation on the order of 5000 rpm. Alternatively, the second rotational actions may initially be rotation at an intermediate speed in the range of 2000 to 3000 rpm which is continuously followed by rotation at a higher speed on the order of 5000 rpm. The time interval between the first and second rotational actions is ten times the duration of the first rotational action or longer. The duration of the second rotational action is three times the duration of the first rotational action or longer.

In such a method, the sufficient time interval provided for a transition from the first rotational action to the second rotational action makes the applied liquid more conformable to the substrate surface. Further, since the second rotational action is faster and longer in duration than the first rotational action, the applied liquid is sufficiently dispersed on the substrate to provide a film having the desired thickness on the substrate.

DETAILED DESCRIPTION OF THE PREFERRED EMBODIMENTS

The preferred embodiments of the present invention will now be described with reference to the accompanying drawings.

Figure 1:
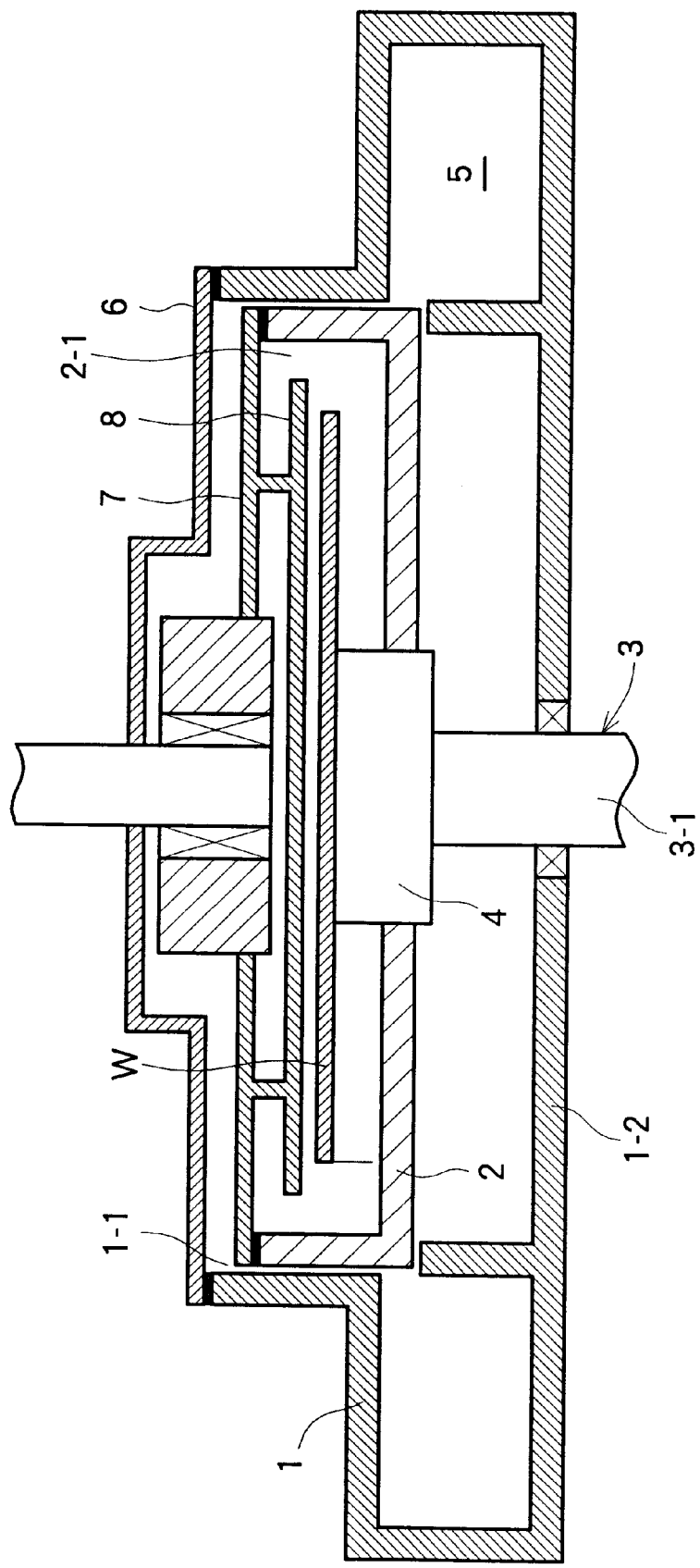
FIG. 1 is an illustrative sectional view of a rotating cup type applier used in the implementation of a method according to the present invention.

FIG. 1 is an illustrative sectional view showing an example of a rotating cup type applier used in the implementation of a method of forming a coating film according to the present invention. The rotating cup type applier is constructed by rotatably fitting a circular and cup-shaped inner cup 2 into a circular outer cup 1. The inner cup 2 is mounted to a spinner device 3 having an axis portion 31 vertically inserted through a bottom portion 1-2 of the outer cup 1 to be rotated at a high speed. A vacuum chuck 4 for absorb-fixing a substrate W such as a semiconductor wafer which is an object to be processed in the form of a plate is provided on the upper end of the axis portion of the spinner device 3. A recovery path 5 for receiving drainage from discharge paths (not shown) extending from the inner cup 2 is provided near the periphery of the outer cup 1.

The outer cup 1 and inner cup 2 have openings 1-1 and 2-1, respectively, at the top portions thereof. These openings 1-1 and 2-1 are configured to be hermetically closed by openable lid elements 6 and 7, respectively. A rectifier plate 8 which forms a very limited space (gap) with the surface of the substrate W absorb-fixed on the vacuum chuck 4 is provided at the underside of the lid element 7 for closing the opening 2-1 of the inner cup.

An SOG (spin-on-glass which is, as previously described, a solution obtained by dissolving a silicon compound in an organic solvent or a silicon oxide film formed by applying and baking this solution) solution is uniformly applied to the surface of the substrate using the rotating cup type applier as described above. To accomplish this, the lid elements 6 and 7 are first moved upward to open the openings 1-1 and 2-1 of the outer cup 1 and inner cup 2, respectively. Next, the SOG solution is dropped on the surface of the substrate W absorb-fixed on the vacuum chuck 4. The lid elements 6 and 7 are then lowered to hermetically close the opening 2-1 of the inner cup 2 and the opening 1-1 of the outer cup 1, and the vacuum chuck 4 and inner cup 2 are integrally rotated by the spinner 3. The SOG solution is dispersed on the surface of the substrate W, to be applied thereto, by the centrifugal force of this rotational action.

The rotational action of the substrate W causes the gas (air) inside the inner cup 2 to be ejected through the recovery path 5, thereby depressurizing the interior of the inner cup 2. Further, since the gap between the surface of the substrate W and the lower surface of the rectifier plate 8 is very small, substantially no air flow affects the liquid applied to the surface of the substrate W and only the centrifugal force acts thereon during the rotation.

The method according to the present invention will now be described in detail.

Figure 2:
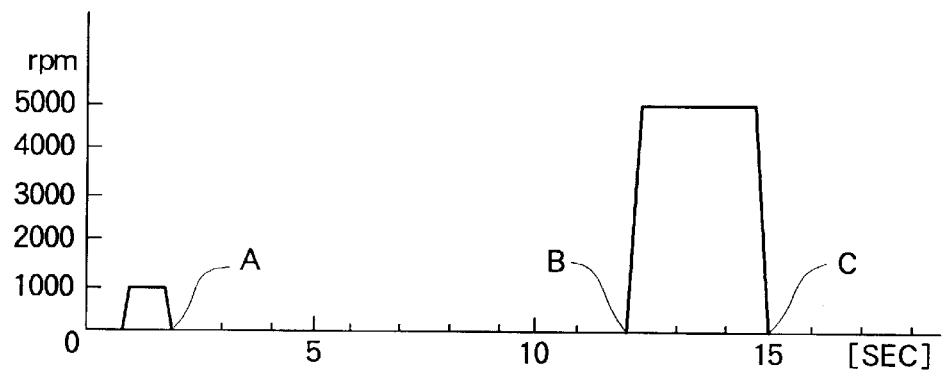
FIG. 2 is a graph showing the relationship between rotational speed and elapsed time in a method of forming a coating film according to a first embodiment of the present invention.
Figure 3:
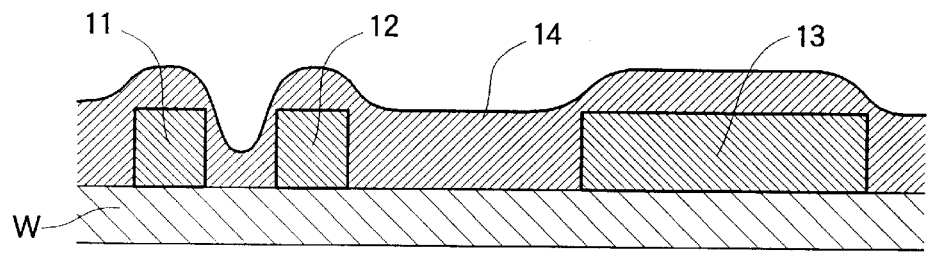
FIG. 3 is a sectional view of major parts showing the thickness of the coating film at the point in time A in the graph in FIG. 2.
Figure 4:
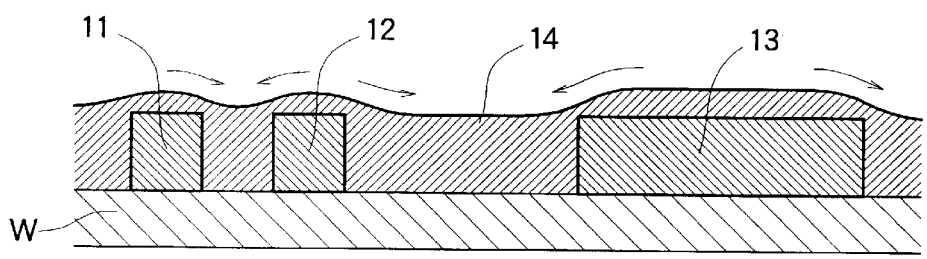
FIG. 4 is a sectional view of major parts showing the thickness of the coating film at the point in time B in the graph in FIG. 2.
Figure 5:
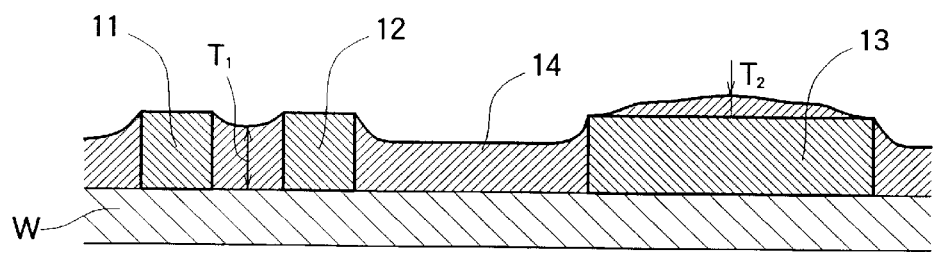
FIG. 5 is a sectional view of major parts showing the thickness of the coating film at the point in time C in the graph in FIG. 2.

FIG. 2 is a graph showing the relationship between the rotational speed of the substrate W and the elapsed time during the implementation of the coating film forming method according to the first embodiment of the present invention. FIG. 3, FIG. 4, and FIG. 5 are sectional views of major parts showing the thickness of the coating film formed on the substrate W at the points in time A, B, and C shown in the graph in FIG. 2, respectively.

In the first embodiment of the present invention, the rotation of the substrate W is separated into a first rotational action at a low speed and a second rotational action at a high speed. The low speed first rotational action is performed at 1000 rpm while the high speed second rotational action is performed at 5000 rpm. The time interval between the first and second rotational actions is ten times the duration of the first rotational action (one second in the present embodiment) or longer, and the duration of the second rotational action is three times the duration of the first rotational action or longer.

On the graph shown in FIG. 2, the rotational action speed (rpm) of the substrate W and the elapsed time (second) are shown along the vertical and horizontal axes, respectively.

As shown in FIG. 3, at the point in time A in FIG. 2 immediately after the termination of the first rotational action, the SOG application solution 14 has been formed on the twin patterns 11 and 12 and the global pattern 13 on the substrate W to a thickness equal to or greater than the desired value, and the SOG application liquid has entered the gap between the twin patterns 11 and 12 with a thickness equal to or smaller than the desired value.

At the point in time B on the graph, at which the high speed second rotational action is started at a time interval ten times the duration of the first rotational action after the end of the first rotational action, as shown in FIG. 3, the SOG application liquid 14 deposited on the patterns 11, 12, and 13 flows into the gaps between the patterns 11, 12, and 13.

At the point in time C on the graph by which the high speed rotation has ended, as shown in FIG. 5, the thickness of the SOG application liquid 14 on the twin patterns 11 and 12 is substantially zero while the thickness of the SOG application liquid on the global pattern 13 is small as a whole, although somewhat larger in the central portion thereof.

Specifically, the first embodiment substantially provides desired values for the thickness $T_1$ of the SOG film 14 between the twin patterns 11 and 12 and the thickness $T_2$ of the SOG film 14 on the global pattern 13.

An experiment with the time interval between the first and second rotational actions set shorter than ten times the duration of the first rotation resulted in insufficient conformity of the SOG application solution and hence an insufficient thickness of the SOG film 14 between the twin patterns 11 and 12. Further, an experiment with the duration of the second rotational action set shorter than three times the that of the first rotational action resulted in appreciable thicknesses of the SOG film 14 on the twin patterns 11 and 12 and the global pattern 13 which were greater than the desired values, making it impossible to make the thickness of the SOG film 14 sufficiently small.

It is therefore necessary to make the time interval between the low speed first rotational action and the high speed second rotational action equal to or greater than ten times the duration of the first rotational action and to make the duration of the second rotational action equal to or greater than three times the duration of the first rotational action.

Figure 6:
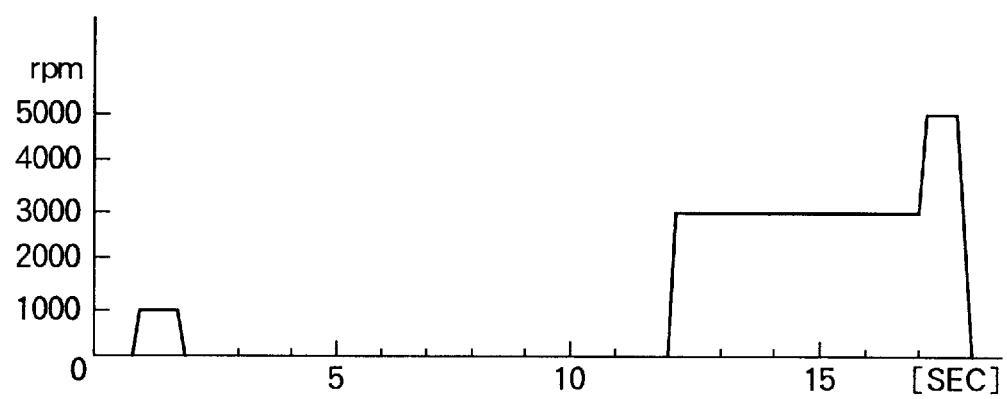
FIG. 6 is a graph showing the relationship between rotational speed and elapsed time in a method of forming a coating film according to a second embodiment of the present invention.

FIG. 6 is a graph showing the relationship between the rotational speed of the substrate W and the elapsed time during the implementation of a coating film forming method according to a second embodiment of the present invention. As in the above-described first embodiment, the rotational speed (rpm) of the substrate W and the elapsed time (second) are shown along the vertical and horizontal axes, respectively.

In the second embodiment, the rotation of the substrate W is separated into first rotational action at a low speed and second rotational action the speed of which is continuously changed from an intermediate speed to a high speed.

In the second embodiment, the low speed rotation is at a speed of 900 rpm; the intermediate speed rotation is at a speed in the range between 2000 to 3000 rpm; and the high speed rotation is at a speed higher than the intermediate speed rotation by 2000 rpm or more. Further, the duration of rotation is one second for the low speed rotation, 3–7 seconds (substantially five times that of the low speed rotation) for the intermediate speed rotation, and one second (the same as that for the first rotation) or more for the high speed rotation (5000 rpm). The time interval between the first and second rotational actions is ten times the duration of the first rotational action or longer as in the first embodiment, and the duration of the second rotational action is six times the duration of the first rotational action or longer because the intermediate speed rotation and the high speed rotation continuously occur.

The time interval between the first and second rotational actions is set five times the duration of the first rotational action or longer and thirty times the duration of the first rotational action or shorter because the movement of the solution 14 does not terminate in the interval if it is too short and the solution begins to dry in the interval if it is too long. Uniform application could not be achieved if the duration of the second rotational action was three times the duration of the first rotational action or shorter.

Figure 7:
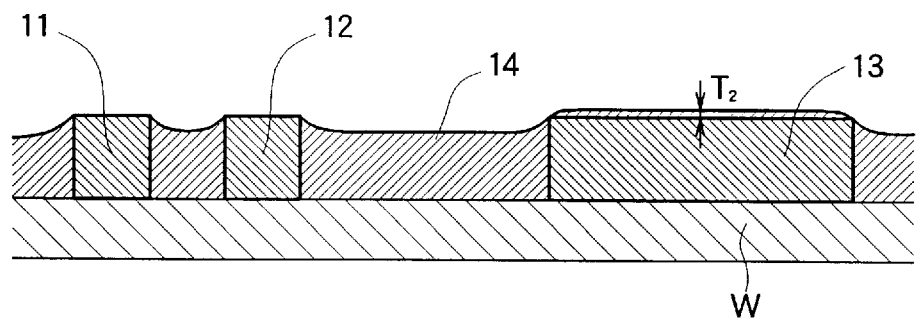
FIG. 7 is a sectional view of major parts showing the thickness of the coating film formed using the coating film forming method according to the second embodiment of the present invention.
Figure 8:
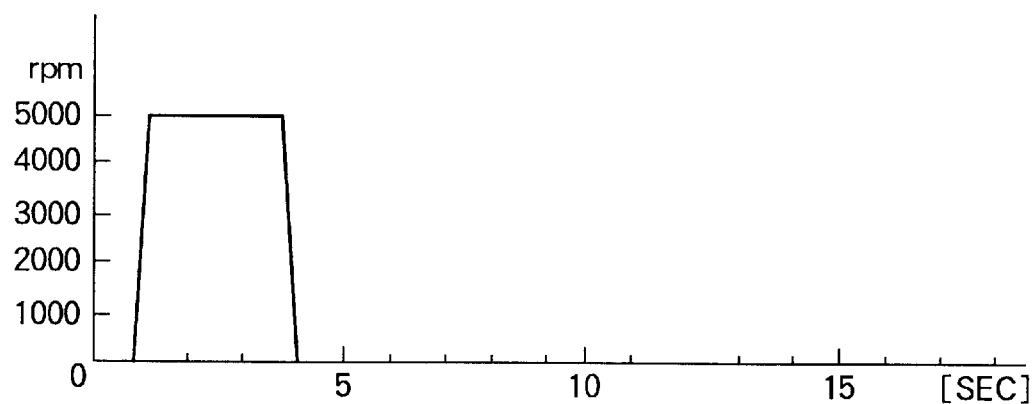
FIG. 8 is a graph showing the relationship between rotational speed and elapsed time in a conventional method of forming a coating film.
Figure 9:
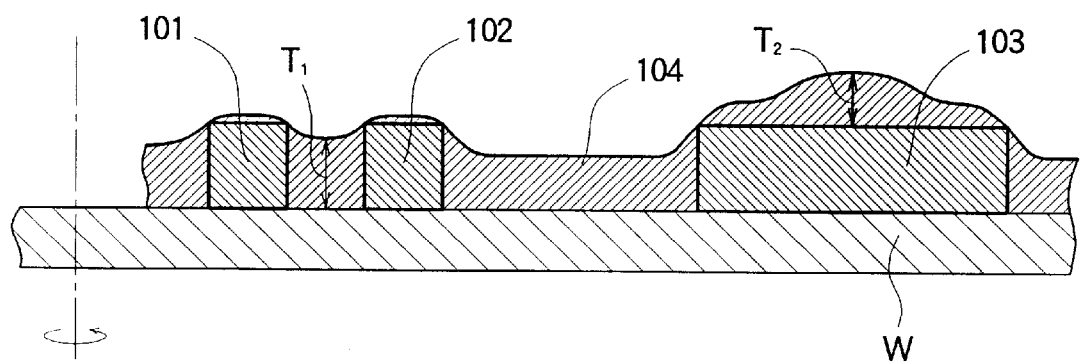
FIG. 9 is a sectional view of major parts showing the thickness of the coating film formed using the conventional coating film forming method.

FIG. 7 is a sectional view of major parts of the substrate W showing the thickness of a coating film formed using the coating film forming method according to the second embodiment of the present invention. As apparent from this figure, the slightly thicker portion $T_2$ of the SOG application liquid left at the central portion of the global pattern 13 can be formed to a uniformly small thickness in this second embodiment.

The preferred embodiments of the present invention have been described in detail. According to the present invention, there is provided a method of forming a coating film by dropping application liquid on the surface of a substrate such as a semiconductor wafer having irregularities such as wiring formed thereon and dispersing the application liquid on the substrate surface using a centrifugal force generated by rotating the substrate wherein the rotation of the substrate, is separated into first and second rotational actions with a timed interval therebetween. The first rotational action involves rotation at a low speed while the second rotational action involves rotation at a high speed. Alternatively, the second rotational action may initially involve rotation at an intermediate speed which is continuously followed by rotation at a higher speed. Since the time interval between the first and second rotational actions is set equal to or longer than the duration of the first rotational action, to a sufficient time is provided for the transition from the first rotational action to the second rotational action, and the applied liquid becomes more conformable to the substrate surface. Further, by setting the duration of the second rotational action equal to or longer than a predetermined multiple of the duration of the first rotational action, the liquid applied to the substrate is dispersed sufficiently to provide a film of the desired thickness on the substrate. In addition, by making the second rotational action faster and longer in duration than the first rotational action, the applied liquid is, again, sufficiently dispersed to provide a film of the desired thickness on the substrate.

The present invention provides the advantages as described above.

While specific illustrated embodiments have been shown and described, it will be appreciated by those skilled in the art that various modifications, changes and additions can be made to the invention without departing from the spirit and scope thereof as set forth in the following claims.

What is claimed is:

1. A method of forming a coating film by dropping application liquid on a surface of an object to be processed in the form of a plate having irregularities formed thereon and dispersing the application liquid on the surface of the object using a centrifugal force generated by rotating the object, comprising the steps of:

rotating an object to be processed in the form of a plate in a first rotational action at a low speed for dispersing the application liquid on the surface of the object and in a second rotational action at a high speed for adjusting a thickness of the dispersed application liquid on the surface of the object, said first and second rotational actions being separated by a time interval; and setting the time interval between the first and the second rotational actions to a value equal to or greater than ten times a duration of the first rotational action and setting a duration of the second rotational action to a value equal to or greater than three times the duration of the first rotational action.

2. The method of forming a coating film according to claim 1, wherein the duration of the first rotational action is shorter than two seconds.

3. A method of forming a coating film by dropping application liquid on a surface of an object to be processed in the form of a plate having irregularities formed thereon and dispersing the application liquid on the surface of the object using a centrifugal force generated by rotating the object, comprising the steps of:

rotating the object to be processed in the form of a plate in a first rotational action at a low speed and a second rotational action at a high speed. said first and second rotational action being separated by a time interval;

setting the time interval between the first and second rotational actions to a value equal to or greater than ten times a duration of the first rotational action and setting a duration of the second rotational action to a value equal to or greater than three times the duration of the first rotational action; and the speed of said first rotational action is approximately 1,000 rpm and the high speed of said second rotational action is approximately 5,000 rpm.

4. The method of forming a coating film according to claim 1, wherein the rotating step is performed in an atmosphere wherein substantially no air flow affects the application liquid.

5. The method of forming a coating film according to claim 1, wherein the application liquid is an SOG solution.

6. The method of forming a coating film according to claim 1, wherein the object to be processed is a semiconductor wafer.

7. A method of forming a coating film by dropping application liquid on a surface of an object to be processed in the form of a plate having irregularities formed thereon and dispersing the application liquid on the surface of the object using a centrifugal force generated by rotating the object, comprising:

rotating the object to be processed in the form of a plate in a first rotational action at a low speed for dispersing the application liquid on the surface of the object and in a second rotational action at a high speed for adjusting a thickness of the dispersed application liquid on the surface of the object, said first and second rotational actions being separated by a time interval;

setting the time interval between the first and second rotational action to a value equal to at least ten times a duration of the first rotational action and setting a duration of the second rotational action to at least six times the duration of the first rotational action; and the second rotational action comprising rotation at an intermediate speed which is continuously followed by rotation at the high speed.

8. The method of forming a coating film according to claim 7, wherein the duration of the first rotational action is shorter than two seconds.

9. A method of forming a coating film by dropping application liquid on a surface of an object to be processed in the form of a plate having irregularities formed thereon and dispersing the application liquid on the surface of the object using a centifugal force generated by rotating the object, comprising the steps of:

rotating the object to be processed in the form of a plate in a first rotational action at a low speed and a second rotational action at a high speed, said first and second rotational actions being separated by a time interval;

the second rotational action comprising rotation at an intermediate speed which is continuously followed by rotation at the high speed;

setting the time interval between the first and second rotational actions to a value equal to or greater than ten times a duration of the first rotational action and setting a duration of the second rotational action to a value equal to or greater than three times the duration of the first rotational action; and the low speed of said first rotational action is approximately 900 rpm, the intermediate speed of the second rotational action is in a range between 2,000 to 3,000 rpm; and the high speed of said second rotational action is faster than the intermediate speed by approximately 2,000 rpm.

10. The method of forming a coating film according to claim 7, wherein the rotating step is performed in an atmosphere wherein substantially no air flow affects the application liquid.

11. The method of forming a coating film according to claim 7, wherein the application liquid is an SOG solution.

12. The method of forming a coating film according to claim 7, wherein the object to be processed is a semiconductor wafer.

13. A method of forming a coating film of an application liquid on a surface of an object to be processed in the form of a plate having irregularities formed thereon, comprising the steps of:

dropping application liquid on a surface of an object to be processed in the form of a plate, said plate surface having irregularities thereon;

rotating said object in a first rotational action at a low speed for dispersing the application liquid over the surface of the object;

further rotating said object in a second rotational action at a high speed for adjusting a thickness of the dispersed application liquid on the object;

said first and second rotational actions being separated by a time interval at least as great as ten times duration of the first rotational action; and a duration of said second rotational action being at least as great as three times said duration of the first rotational action.

14. The method according to claim 13, wherein the application liquid is an SOG solution, and the duration of said first rotational action is shorter than two seconds.

15. The method of forming a coating film according to claim 13, wherein said first and second rotational actions are performed in an atmosphere wherein substantially no ambient gas flow affects the application liquid.

16. A method of forming a coating film of an application liquid on a surface of an object to be processed in the form of a plate having irregularities formed thereon, comprising the steps of:

dropping application liquid on a surface of an object to be processed in the form of a plate, said plate having irregularity thereon;

rotating said object in a first rotational action at a low speed;

further rotating said object in a second rotational action a high speed;

said first and second rotational actions being separated by time intervals at least as ten times the duration of the first rotational action;

a duration of said second rotational action being at least as great as three times said duration of the first rotational action; and the low speed of said first rotational action is approximately 1,000 rpm and the high speed of second rotational action is approximately 5,000 rpm.

17. The method of forming a coating film according to claim 13, wherein said second rotational action comprises rotation of the object at an intermediate speed continuously followed by a rotation of the object at the high speed, and wherein the time interval between a first and second rotational actions is at least ten times the duration of the first rotational action and the duration of the second rotational action is at least six times the duration of the first rotational action.

18. A method of forming a coating film of an application liquid on a surface of an object to be processed in the form of a plate having irregularities thereon, comprising the steps:

dropping application liquid on a surface of an object to be processed in the form of a plate, said plate having irregularities thereon;

rotating said object in a first rotational action at a low speed;

further rotating said object in a second rotational action at a high speed;

said first and second rotational action being separated by a time interval at least as great as ten times a duration of the first rotational action;

a duration of said second rotational action being at least as great as three times said duration of the first rotational action;

said second rotational action comprising rotation of the object at an intermediate speed continuously followed by a rotation of the object at the high speed; and the low speed of said first rotational action is approximately 900 rpm, the intermediate speed of the second rotational action is in a range of 2,000–3,000 rpm, and that a high speed of the second rotational action is faster than the intermediate speed by approximately 2,000 rpm.

19. The method of forming a coating film according to claim 13, wherein the second rotational action comprises rotation at an intermediate speed continuously followed by rotation at the high speed, and wherein the time interval between the first and second rotational actions is in a range of 5–30 times the duration of the first rotational action, and the duration of the second rotational action is at least three times the duration of the first rotational action.

* * * * *

UNITED STATES PATENT AND TRADEMARK OFFICE
CERTIFICATE OF CORRECTION

PATENT NO. : 6,277,441 B1  Page 1 of 1
DATED : August 21, 2001
INVENTOR(S) : Endo et al.

It is certified that error appears in the above-identified patent and that said Letters Patent is hereby corrected as shown below:

Column 2,
Line 2, change "rotation" to -- rotational action --;
Line 4, change "actions" to -- action --;
Line 5, change "actions" to -- action --.

Column 4,
Line 27, change "rotation" to -- rotational action --;
Line numbered between 30 and 31, change "the that" to -- that --.

Column 5,
Line numbered between 28 and 29, after "substrate" insert a comma;
Line numbered between 29 and 30, after "substrate" delete the comma;
Line numbered between 30 and 31, change "timed" to -- time --;
Line numbered between 38 and 39, change "to a" to -- a --.

Column 8,
Line 6, after "action" insert -- at --;
Line 9, before "ten" insert -- great as --.

Signed and Sealed this

Ninth Day of April, 2002

Attest:

*Attesting Officer*

JAMES E. ROGAN
*Director of the United States Patent and Trademark Office*